United States Patent [19]
Asada

[11] Patent Number: 6,133,624
[45] Date of Patent: Oct. 17, 2000

[54] SEMICONDUCTOR DEVICE UTILIZING A LEAD ON CHIP STRUCTURE

[75] Inventor: Junichi Asada, Kawasaki, Japan

[73] Assignee: Kabushiki Kaisha Toshiba, Kawasaki, Japan

[21] Appl. No.: 09/013,519

[22] Filed: Jan. 26, 1998

[30] Foreign Application Priority Data

Jan. 29, 1997 [JP] Japan ................................. 9-015300

[51] Int. Cl.$^7$ ................................................. H01L 23/495
[52] U.S. Cl. ...................... 257/668; 257/669; 257/670; 257/674; 257/676; 257/691; 257/692; 257/784; 257/787; 361/723; 361/772; 361/813
[58] Field of Search .................................... 257/666, 668, 257/784, 696, 669, 676, 691, 672, 692, 670, 674, 787, 735, 126, 127; 438/123, 124, 366, 369, 377, 380; 361/723, 728, 772, 813; 29/841, 848, 854, 855, 856

[56] References Cited

U.S. PATENT DOCUMENTS

| Re. 35,496 | 4/1997 | Yamamura et al. | 174/52.4 |
|---|---|---|---|
| 5,227,232 | 7/1993 | Lim | 428/344 |
| 5,371,044 | 12/1994 | Yoshida et al. | 438/124 |
| 5,760,468 | 6/1998 | King et al. | 257/676 |
| 5,821,605 | 10/1998 | Hong et al. | 257/666 |
| 5,874,783 | 2/1999 | Yamada | 257/778 |
| 5,914,529 | 6/1999 | King et al. | 257/666 |

FOREIGN PATENT DOCUMENTS

| 6-260592 | 9/1994 | Japan . |
|---|---|---|
| 7-335818 | 12/1995 | Japan . |

*Primary Examiner*—John Guay
*Assistant Examiner*—Alonzo Chambliss
*Attorney, Agent, or Firm*—Finnegan, Henderson, Farabow, Garrett & Dunner, L.L.P.

[57] ABSTRACT

A semiconductor device comprises a semiconductor chip having a major surface, a plurality of bonding pads provided on the major surface of the semiconductor chip, an adhesive tape provided on a selected part of the major surface of the semiconductor chip, and a plurality of inner leads mounted on the adhesive tape, each adhered at a lower surface thereof to the adhesive tape. The device further comprises a wiring lead, bonding wires, and a resin-molded package. The wiring lead has at least one end portion and spaced apart from the major surface of the chip. The at least one end portion is depressed from the inner leads toward the semiconductor chip, located outside the adhesive tape and formed integral with at least one of the inner leads. The bonding wires are spaced apart from the wiring lead and connected, at one end, to upper surfaces of the inner leads other than the inner lead which is formed integral with the at least one end portion of the wiring lead, and at the other end, to the bonding pads which are provided on the chip. The resin-molded package encapsulates the semiconductor chip, the adhesive tape, the inner leads, the wiring lead and the bonding wires.

12 Claims, 6 Drawing Sheets

SEMICONDUCTOR DEVICE UTILIZING A LEAD ON CHIP STRUCTURE

BACKGROUND OF THE INVENTION

The present invention relates to a semiconductor device and a method of manufacturing the device, and more particularly to a package of LOC (Lead On Chip) structure which has a limited thickness.

Figure 1:
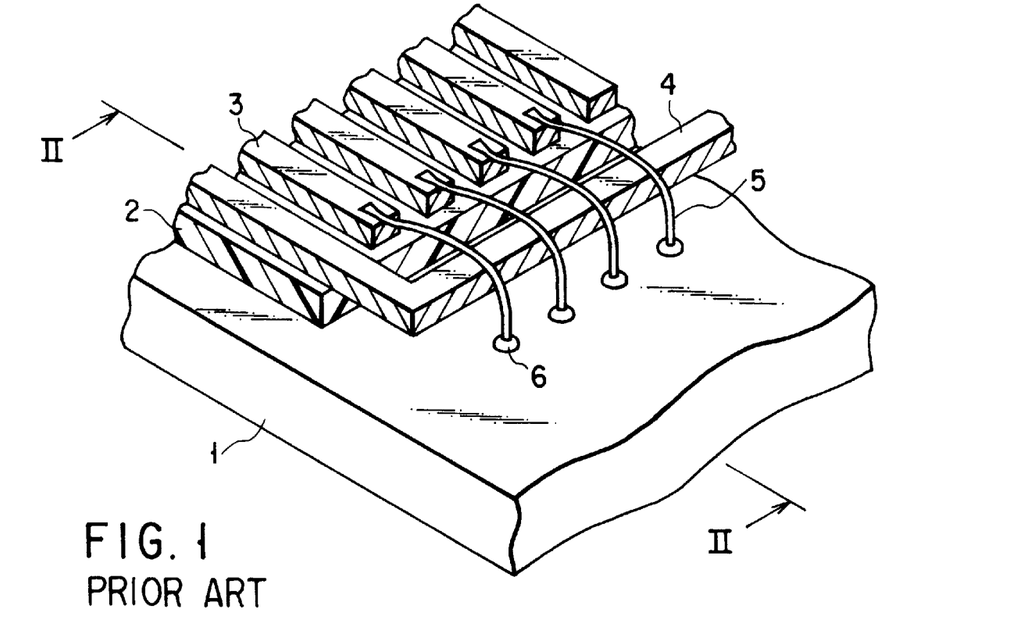
FIG. 1 is a perspective view of a conventional semiconductor device of LOC structure.

FIG. 1 shows a conventional semiconductor device of LOC structure. The device comprises a semiconductor chip 1, a tape 2 adhered to a major surface of the chip 1, and inner leads 3 mounted on the tape 2. The inner leads 3 are connected by bonding wires 5 to the bonding pads 6 provided on the semiconductor chip 1.

As shown in FIG. 1, a wiring lead 4 is provided under the bonding wires 5, crossing the wires 5. The wiring lead 4 is applied with, for example, the power-supply potential.

Short circuiting between the wiring lead 4 and any bonding wire 5 must be prevented. To this end, the bonding wires 5 need to be arched over the wiring lead 4, with its height part located above the wiring lead 4. The upper surface of the wiring lead 4 is at the same level as that of each inner lead 3. It is therefore required that the highest part of each wire 5 should be at a level higher than in the case where no wiring lead 4 is provided. Furthermore, that part of the resin-molded package for the device, which is provided on the lead frame, must be so thick that the bonding wires 5 may not be exposed at the surface of the package.

Figure 2:
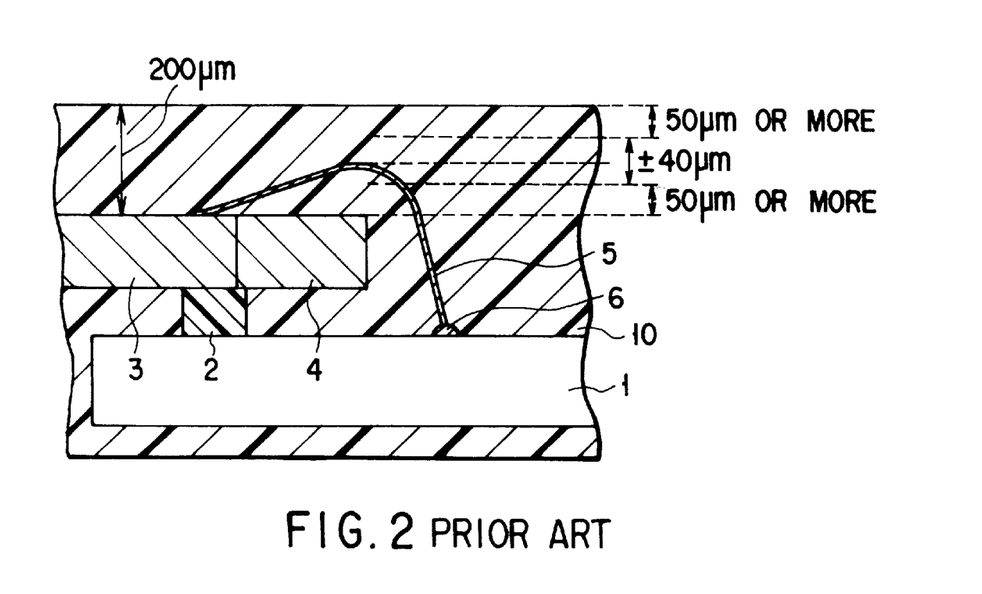
FIG. 2 is a cross-sectional view of the semiconductor device, taken along line II—II in FIG. 1.

FIG. 2 is a cross-sectional view of the semiconductor device, taken along line II—II in FIG. 1. As shown in FIG. 2, the highest part of each bonding wire 5 must be spaced apart by about 50 $\mu$m from the wiring lead 4 and from the surface of the package. The bonding wires 5 would otherwise contact the wiring lead 4 and be exposed.

When the bonding wires 5 are applied to the semiconductor chip 1, the height tolerance for the wires 5 is about 1 $\sigma$ (=10 $\mu$m). The highest part of each bonding wire 5 is likely to move vertically for 4 $\sigma$, or ±40 $\mu$m. In view of this, a resin layer which is 180 $\mu$m or more thick must be provided on the wiring lead 4.

Generally, the standard thickness for the resin layer on the lead frame is about 0.5 mm in the case of an SOJ (Small Outline J-leaded) package, and is about 200 $\mu$m in the case of a TSOP (Thin Small Outline Package). In a TSOP it would be difficult for the resin layer on the lead frame to have a thickness less than the standard value (about 200 $\mu$m).

BRIEF SUMMARY OF THE INVENTION

The object of the present invention is to provide a semiconductor device in which the bonding wires are not exposed or do not contact the wiring lead which extends under the bonding wires.

To achieve the object, a semiconductor device according to the invention comprises: a semiconductor chip having a major surface; a plurality of bonding pads provided on the major surface of the semiconductor chip; an adhesive tape provided on a selected part of the major surface of the semiconductor chip; a plurality of inner leads mounted on the adhesive tape, each adhered at a lower surface thereof to the adhesive tape; a wiring lead having at least one end portion and spaced apart from the major surface of the semiconductor chip, the at least one end portion is depressed from the inner leads toward the semiconductor chip, located outside the adhesive tape and formed integral with at least one of the inner leads; a plurality of bonding wires spaced apart from the wiring lead and connected, at one end, to upper surfaces of the inner leads other than the inner lead which is formed integral with the at least one end portion of the wiring lead, and at the other end, to the bonding pads which are provided on the semiconductor chip; and a resin-molded package encapsulating the semiconductor chip, the adhesive tape, the inner leads, the wiring lead and the bonding wires.

Preferably, the at least one end portion of the wiring lead may be depressed by a distance less than a thickness of the adhesive tape.

The semiconductor device may further comprise a first support lead formed integral with the wiring lead, holding the wiring lead, adhered at a lower surface thereof to the adhesive tape, having a portion depressed toward the semiconductor chip, and connected at the depressed portion to the wiring lead.

It is desirable that a gap between the wiring lead and the semiconductor chip be filled with resin.

The semiconductor device may further comprise an additional bonding wire connected at one end to that portion of the at least one of the inner leads which is provided on the adhesive tape, and connected at the other end to a corresponding one of the bonding pads.

The at least one of the inner leads, which is connected to the additional bonding wire and the wiring lead, may be other than two outermost ones of the inner leads which are arranged in parallel to one another.

The semiconductor device may further comprise a second support lead which is connected to the wiring lead at around a node between the wiring lead and the at least one of the inner leads connected to the wiring lead. The second support lead may be connected to the at least one of the inner leads, defining therewith an angle ranging from 45° to 225°, the angle being one measured in a region where the wiring lead is absent.

It is more preferable that the angle formed between the at lest one of the inner leads and the second support lead is set to be around 90° and 180° in view of simpler package design and wiring lead support effect.

According to the invention, there is provided a method of manufacturing a semiconductor device, comprising the steps of: preparing a lead frame having a plurality of inner leads, an adhesive tape adhered to lower surfaces of the inner leads, and a wiring lead connected to at least one of the inner leads and having at least one end portion depressed downwards from the inner leads; preparing a semiconductor chip having a major surface and a plurality bonding pads provided on the major surface; providing a gap between the wiring lead and the semiconductor chip and bonding the inner leads to the major surface of the semiconductor chip; connecting upper surfaces of the inner leads to the bonding pads by bonding wires; and encapsulating the semiconductor chip, the lead frame and the bonding wires in a mass of resin.

Preferably, the step of preparing the lead frame may include a step of depressing the least one end portion of the wiring lead by a distance less than a thickness of the adhesive tape.

The step of preparing the lead frame may include a step of positioning the wiring lead at a level lower than upper surfaces of the inner leads.

Alternatively, the step of preparing the lead frame may include a step of connecting a support lead to the wiring lead at around a node between the wiring lead and the at least one of the inner leads connected to the wiring lead. Preferably, the support lead may be connected to the at least one of the inner leads, defining therewith an angle ranging from 45° to 225°.

The step of connecting the upper surfaces of the inner leads to the bonding pads by bonding wires may include a step of connecting an upper surface of the at least one of the inner leads connected to the wiring lead, to a corresponding one of the bonding pads.

The step of connecting the upper surfaces of the inner leads to the bonding pads by bonding wires may include a step of connecting the at least one of the inner leads connected to the wiring lead, to a corresponding one of the bonding pads by one inner lead other than two outermost ones of the inner leads which are arranged in parallel to one another.

The step of encapsulating the semiconductor chip, the lead frame and the bonding wires in a mass of resin may include a step of filling resin ingredient in a gap between the wiring lead and the semiconductor chip.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described with reference to the accompanying drawings. The components of any embodiment, which are similar or identical to those of the conventional semiconductor device (FIGS. 1 and 2) are designated at the same numerals as those used in used in FIGS. 1 and 2, and will not be described in detail in the following description.

(First Embodiment)

Figure 3:
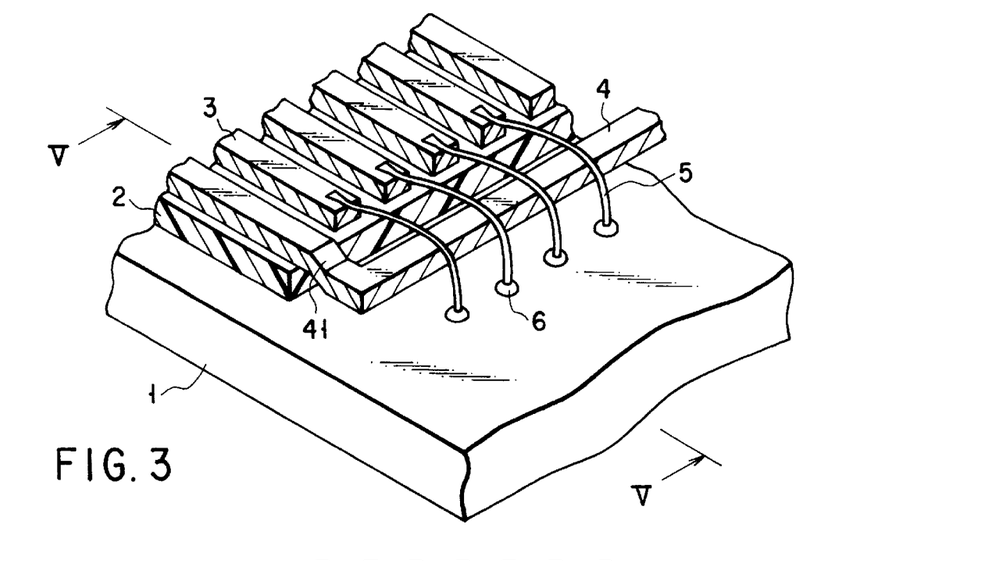
FIG. 3 is a perspective view of a semiconductor device of LOC structure, according to a first embodiment of the present invention.
Figure 4A:
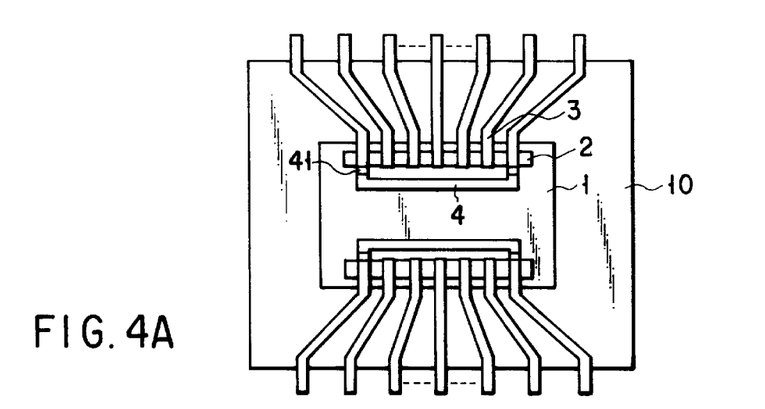
FIG. 4A is a plan view of the semiconductor device shown in FIG. 3.

FIG. 3 and FIG. 4A are a perspective and a plan view of a semiconductor device which is the first embodiment of the invention.

The lead frame used in any embodiment of the invention will not be described in detail, because it is of the type well known in the art. To describe briefly, the lead frame comprises a frame and a plurality of leads, and leads are arranged in the frame in a specific pattern. Each lead consists of two parts, i.e., an outer lead extending outwards from a resin-molded package and an inner lead embedded in the package. Neither the frame nor the outer leads are depicted in the accompanying drawings.

Figure 4B:
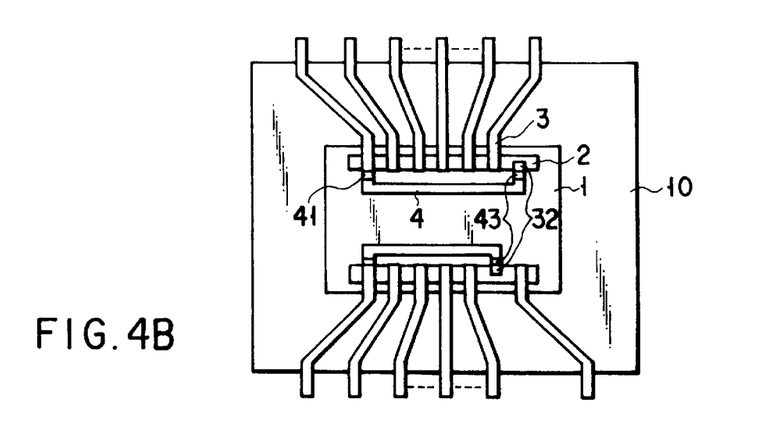
FIG. 4B is a plan view of a modification of the semiconductor device shown in FIG. 3.

As seen from FIGS. 3 and 4B, the first embodiment comprises a semiconductor chip 1 and a tape 2 adhered to the chip 1. Inner leads 3 are mounted on the tape 2. The tape 2 has been bonded to a lead frame, and the lead frame has then been bonded to the semiconductor chip 1.

Bonding wires 5 are connected at one end to those parts of the inner leads 3 which are located on the tape 3, and at the other end to the bonding pads 6 provided on the semiconductor chip 1.

As is best shown in FIG. 3, a wiring lead 4 is provided under the bonding wires 5, crossing the wires 5. The wiring lead 4 is formed integral with the lead frame which includes the inner leads 3. The wiring lead 4 has been depressed toward the semiconductor chip 1, at both end portions 41. As a result, the wiring lead 4 is located at a lever lower than the inner leads 3. No tape is provided below the wiring lead 4.

As shown in FIG. 4A, two sets of inner leads 3 are provided on the opposite sides of the semiconductor chip 1, respectively, and each wiring leads 4 is connected at both end portions 41 to the two outermost inner leads 3 of one set, respectively—as in most semiconductor devices of LOC structure.

In the present invention, each wiring lead 4 need not be connected to the inner leads 3 at both ends. Rather, as shown in FIG. 4B, each wiring lead 4 may have one end secured to the tape 2 by means of a support lead 32 which supports the wiring lead 4. In this modified semiconductor device, the support lead 32 has a depressed end portion 43, which is connected to the wiring lead 4.

Figure 5:
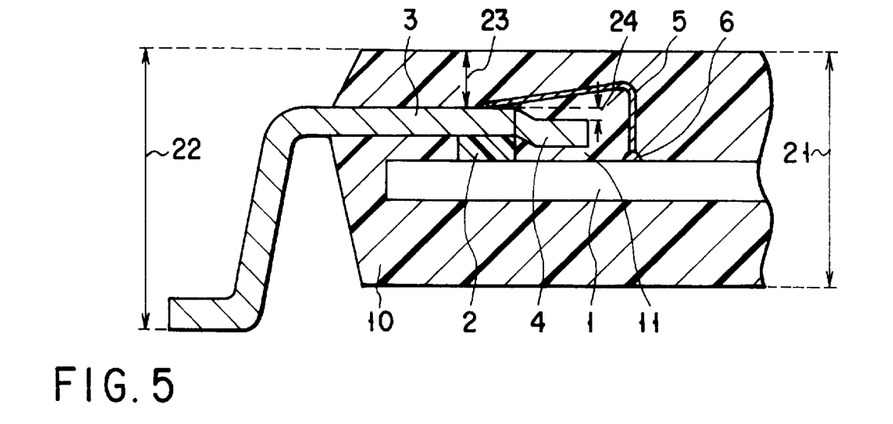
FIG. 5 is a cross-sectional view of the semiconductor device, taken along line V—V in FIG. 3.

The sizes of the components of the first embodiment will be described, with reference to FIG. 5 which is a cross-sectional view of the first embodiment.

Assume that the first embodiment is provided in the form of a TSOP (Thin Small Outline Package) 10 which has a thickness 21 of about 1 mm. Then, that part of the package 10 which lies on the inner leads 3 has a thickness 23 of about 200 $\mu$m; the semiconductor chip 1 is about 250 $\mu$m to 350 $\mu$m thick; the tape 2 is, for example, 87 $\mu$m thick; and the inner leads 3 are, for example, 125 $\mu$m thick. When the package 10 is mounted on, for example, a wiring board, its upper surface is positioned at a distance 22 of about 1.2 mm from the surface of the wiring board.

As in the conventional semiconductor device (FIGS. 1 and 2), the highest part of each bonding wire 5 must be spaced apart by about 50 $\mu$m from the wiring leads 4, and is likely to move vertically for ±40 $\mu$m.

The end portions 41 of each wiring lead 4 have been depressed by such a distance 24 that a gap 11 is provided between the lower surface of the wiring lead 4 and the semiconductor chip 1. The distance 24 is set at 50 μm if the tape 2 is 87 μm thick and the depressing tolerance is ±20 μm. In this case, the gap 11 will be 17 μm or more.

Why the gap 11 is provided will be explained. When the semiconductor chip 1 is cut from a semiconductor wafer by means of dicing, dust is generated from the semiconductor wafer. In most cases, the dust particles adheres to the surfaces of the semiconductor chip 1. The wiring leads 4 may contact the dust particles, possibly damaging the electronic elements formed on the semiconductor chip 1. To prevent this from happening, the gap 11 is provided between the lower surface of the wiring lead 4 and the semiconductor chip 1. If the semiconductor chip 1 has clean surfaces, having no dust particles thereon, the end portions 41 of each wiring lead 4 can be depressed so much that the lead 4 almost touches the semiconductor chip 1.

It is desired that the gap 11 between each wiring lead 4 and the semiconductor chip 1 be filled with resin. If the gap 11 is not filled with resin, water, if any, in the gap 11 will evaporate when the device is mounted on the package 10 at a temperature of about 240° C. Consequently, the pressure in the gap 11 will increase, possibly fracturing the package 10 which is made of resin.

The gap 11 is filled with resin ingredient which is separated from the molding resin containing the resin ingredient and filler. Therefore, it is sufficient for the wiring leads 4 to be spaced from the chip 1 by several microns.

Figure 6:
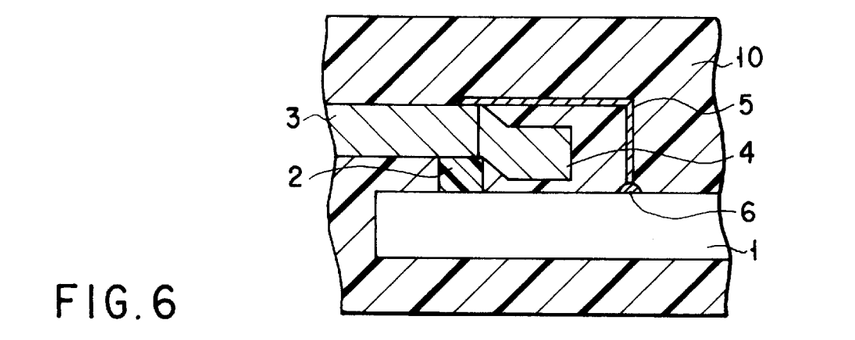
FIG. 6 is a cross-sectional view of the modified semiconductor device illustrated in FIG. 4B.

If the distance the highest part of each bonding wire 5 moves vertically is limited to ±30 μm, and the distance 24 for which the end portions 41 of each wiring lead 4 are depressed is limited to 50 μm ±20 μm, each bonding wire 5 can be arranged as shown in FIG. 6, with its highest part located at a level higher than the upper surfaces of the inner leads 3 by a distance less than its thickness. In this case, the thickness 23 of the resin layer lying on the inner leads 3 is reduced to a minimum.

When the mold of the package 10 is filled with resin, the semiconductor chip 1 is located in the mold, at almost the midpoint in the direction of thickness of the mold, provided that the fluid resistance to the molten resin falls within the tolerance range.

In the first embodiment, the distance 24 for which each wiring lead 4 are depressed at its end portion 41 does not exceed the thickness of the tape 2. Hence, the wiring leads 4 would not contact the semiconductor chip 1. Since The gap 11 between the chip 1 and each lead 4 is filled up with resin, the electronic elements formed on the chip 1 will not be damaged. Nor will the package 10 be fractured at all.

The wiring leads 4 have their upper surfaces located below the positions where the bonding wires 5 are bonded to the inner leads 3. The highest part of each bonding wire 5 can be positioned lower than in the conventional device shown in FIGS. 1 and 2, by the distance 24 for which the wiring lead 4 is depressed at its end portion 41.

As a result of this, the thickness of the package 10 mounted on the lead frame can be of any value within a broader range than in the conventional semiconductor device. That is, the thickness 23 of the resin layer lying on the inner leads 3 is determined in view of the filling easiness of resin, the warping of the package, and the height of the bonding wire loops, as in any package that is relatively thin. The thickness 23 can be deceased because, as mentioned above, the highest part of each bonding wire 5 is positioned lower by the distance 24 for which the end portion 41 of the wiring lead 4 is depressed.

Furthermore, the bonding wires 5 can be shorter than in the conventional semiconductor device shown in FIGS. 1 and 2. The overall inductance and resistance of the first embodiment are therefore lower than those of the conventional device. This helps to enhance the electrical characteristics of the package 10.

(Second Embodiment)

A semiconductor device which is the second embodiment of the present invention will be described, with reference to FIG. 7 which is a perspective view.

Figure 7:
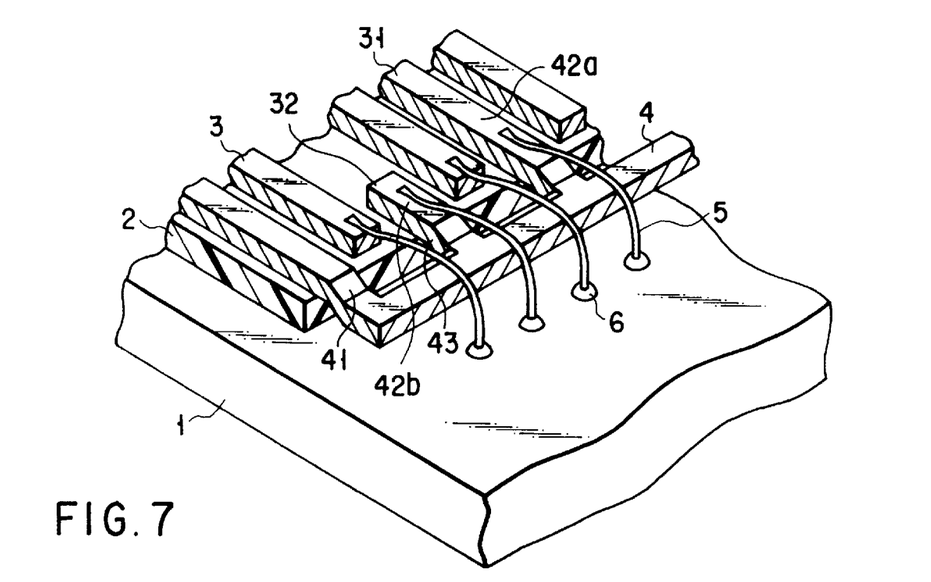
FIG. 7 is a perspective view of a semiconductor device of LOC structure, according to a second embodiment of this present invention.

As shown in FIG. 7, an inner lead 31 has a depressed end, which is connected to the wiring lead 4. Similarly, a support lead 32 has a depressed end portion 43, which is connected to a wiring lead 4. The depressed end portion of the inner lead 31 and the depressed end portion 43 of the support lead 32 have been formed at the same time as the depressed end portions 41 of the wiring lead 4. Two bonding wires 5 are connected at one end to the upper surface 42a of inner lead 3 and the upper surface 42b of the support lead 32, respectively. Other bonding wires 5 are connected at one end to other inner leads 3. All bonding wires 5 are connected at the other end to the bonding pads 6 provided on a semiconductor chip 1.

The inner lead 31, support lead 32 and other inner leads 3 arranged on a tape 2 adhered to the semiconductor chip 1. The inner lead 31 and the support lead 32 are positioned at the same level as the other inner leads 3.

The second embodiment (FIG. 7) has one inner lead 31 and one support lead 32, each having a depressed end portion. Nonetheless, two or more inner leads and two or more support leads 32, each having a depressed end portion, may be provided according to the present invention.

The second embodiment attains the same advantages as the first embodiment. In addition, it is advantageous in that the bonding wire 5 can be connected to an arbitrary bonding pad 6, without crossing another bonding wire, in a case where the support lead 32 is provided adjacent to the arbitrary pad 6.

(Third Embodiment)

Figure 8:
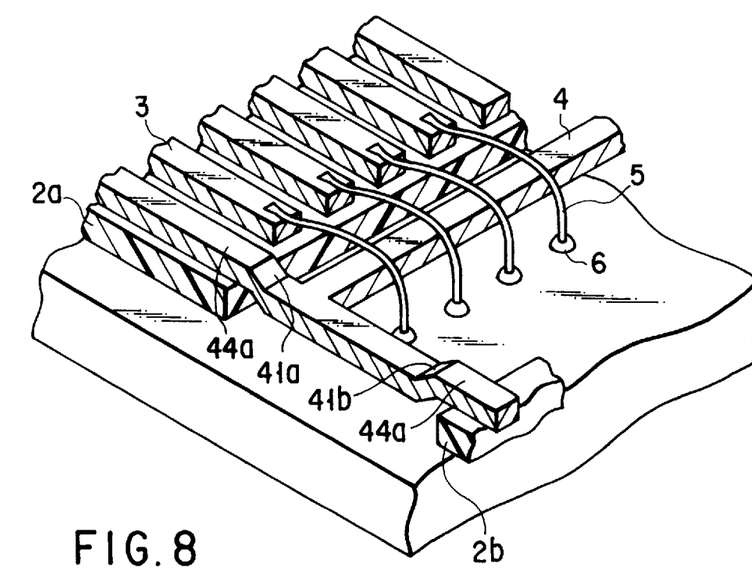
FIG. 8 is a perspective view of a semiconductor device of LOC structure, according to a third embodiment of the present invention.

A semiconductor device which is the third embodiment of the invention will be described, with reference to FIGS. 8 and 9. FIG. 8 is a perspective view of this device, and FIG. 9 is a plan view thereof.

Figure 9:
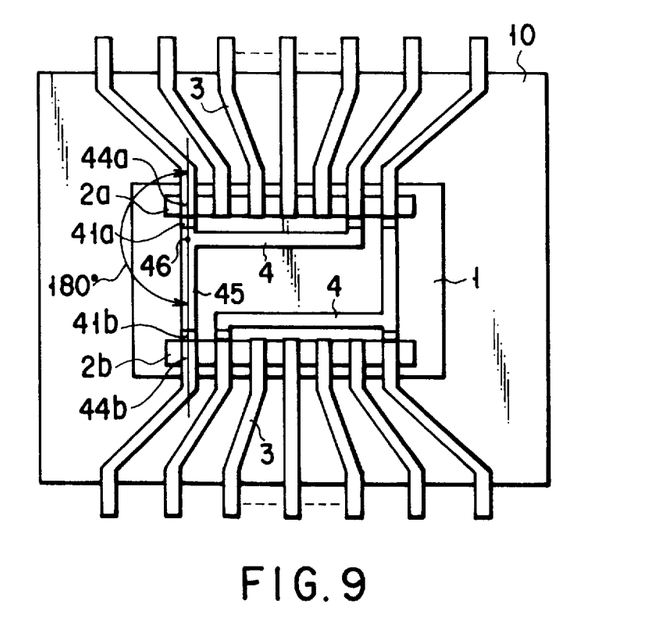
FIG. 9 is a plan view of the semiconductor device shown in FIG. 8.

As is shown in FIGS. 8 and 9, two tapes 2a and 2b are laid on a semiconductor chip 1. The tapes 2a and 2b oppose each other, with rows of bonding pads 6 between them. A group of inner leads 3 are mounted on the tape 2a, and another group of inner leads 3 on the tape 2b.

A wiring lead 4 extends in parallel to the tape 2a. The wiring lead 4 has been depressed toward the semiconductor chip 1, at an end portion 41a. The end portion 41a of the wiring lead 4 are connected to the outermost inner lead 44a of one set. The wiring lead 4 is further connected to a support lead 45. The support lead 45 has a depressed end portion 41b, which is connected to one outermost inner lead 44b of the other set. Thus, the third embodiment has a support lead 45, which prevents the wiring leads 4 from moving downwards.

In the third embodiment shown in FIGS. 8 and 9, one outermost inner lead 44a of each set and the support lead 45 are aligned in a straight line. In other words, the support lead 45 forms an angle of 180° with the inner lead 44a, with respect to point 46 where the support lead 45 is connected to the wiring lead 4.

Figure 10A:
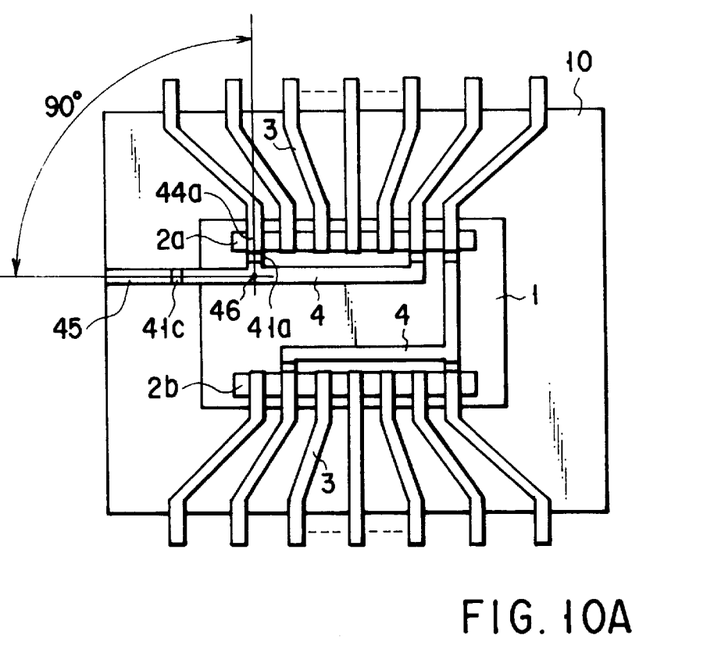
FIGS. 10A, 10B and 10C are plan views of three modifications of the device shown in FIG. 8.
Figure 10B:
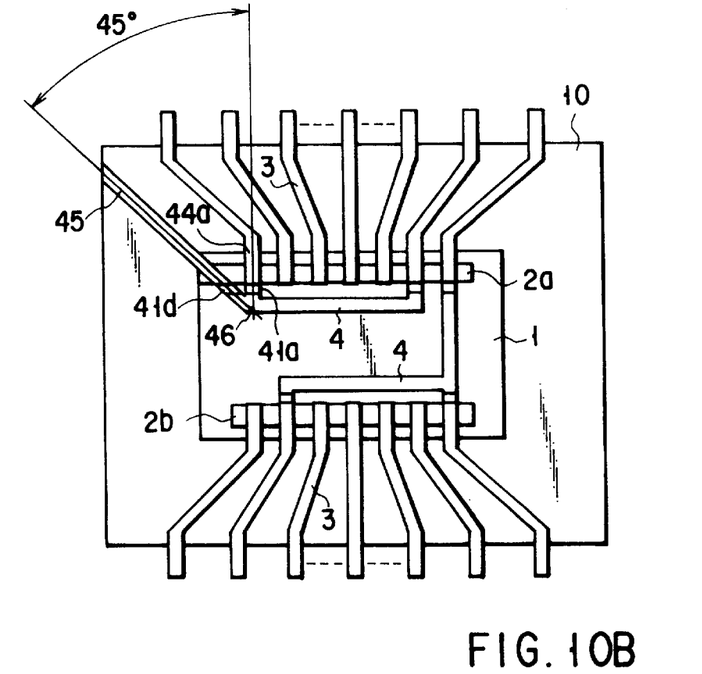
Figure 10C:
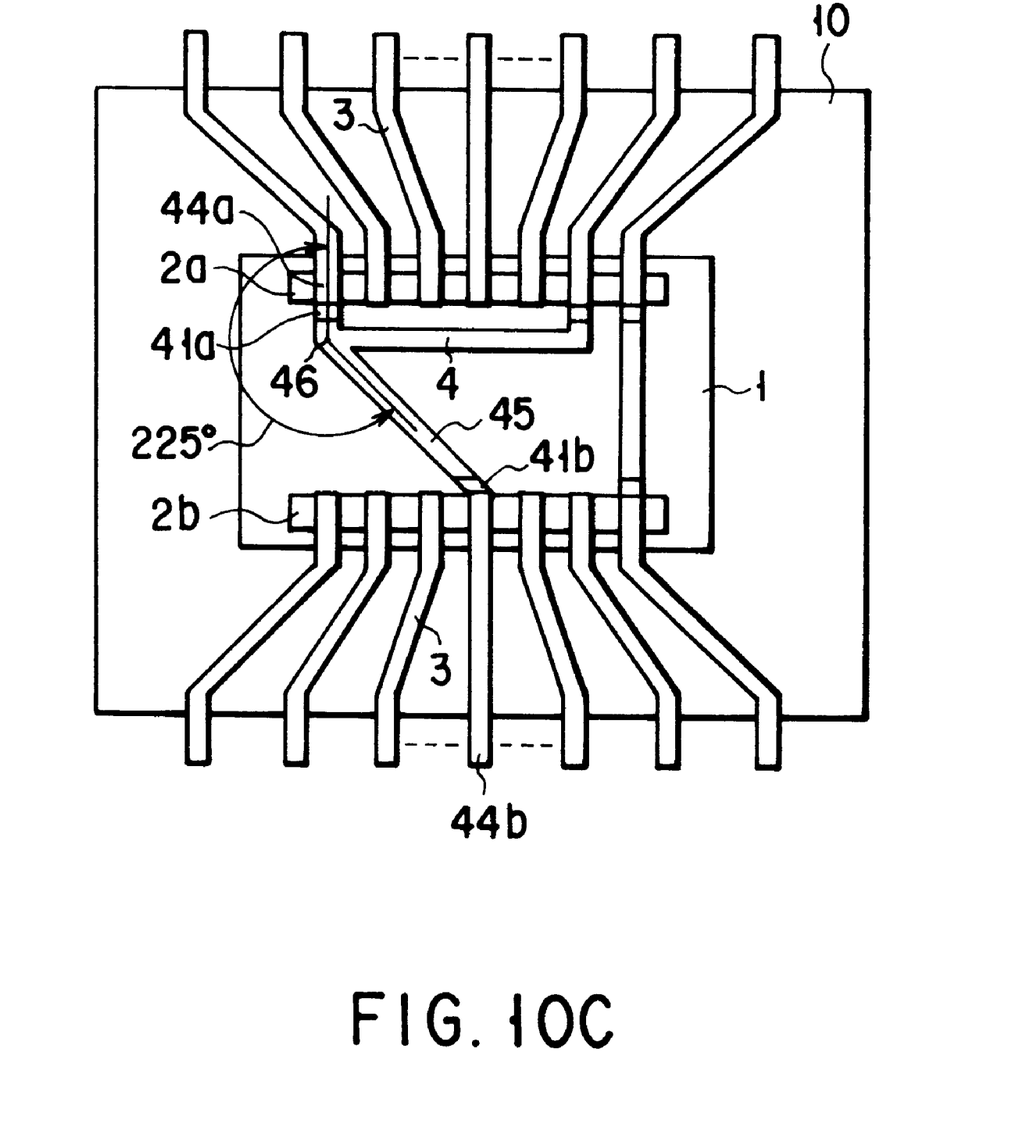

The support lead 45 and the outermost inner lead 44a of one set need not be aligned in a straight line. Rather, the support lead 45 may be inclined at 90° to the outermost inner lead 44a as is shown in FIG. 10A, or at 45° to the outermost inner lead 44a as is illustrated in FIG. 10B. In ether alternative case, the support lead 45 functions as a suspending pin which extends through a resin-molded package 10 and which is connected to a lead frame (not shown). The suspended pin is cut off along the side surface of the molded package 10 after resin molding. Still alternatively, the support lead 45 may be inclined at 225° to one outermost inner lead 44a of one set, as is illustrated in FIG. 10C. However, it is preferable that the angle formed between the outer most inner lead 44a and the support lead 45 is set to be around 90° and 180° in view of simpler package design and wiring lead supporting effect.

The angle between one outermost inner lead 44a and the support lead 45, indicated above, is measured in a region where the wiring lead 4 is absent. If the support lead 45 were inclined to the outermost inner lead 44a at an angle outside the range of 45° to 225°, the support lead 45 could not prevent the wiring lead 4 from moving downwards. Two or more support leads may be connected to each wiring lead 4.

The third embodiment attains the same advantages as the first embodiment. Moreover, the wiring lead 4 is more reliably prevented from moving when the mold of the package 10 is filled with resin, because the wiring lead 4 is connected to two or more leads (i.e., one inner lead and one or more support leads). Hence, the wiring leads 4 would not contact the bonding wires 5 or the semiconductor chip 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor device comprising:
   a semiconductor chip having a major surface;
   a first set of inner leads provided at a first side of the semiconductor chip through a first adhesive tape;
   a second set of inner leads provided at a second side of the semiconductor chip through a second adhesive tape, the second side being opposite the first side;
   a plurality of bonding pads between the first and second sets of inner leads;
   a plurality of bonding wires connected between the inner leads and the bonding pads; and
   a first wiring lead provided between the first and second sets of inner leads, the first wiring lead being supported by two inner leads from one of the first and second sets of inner leads and one inner lead from the other of the first and second sets of inner leads.

2. The semiconductor device according to claim 1, further including a second wiring lead, wherein the second wiring lead is supported by two inner leads from one of the first and second sets of inner leads and one inner lead from the other of the first and second sets of inner leads.

3. The semiconductor device according to claim 1, further including a second wiring lead and a support lead for supporting the second wiring lead, wherein the second wiring lead is supported by two inner leads from one of the first and second sets of inner leads and the support lead extending in a substantially parallel direction from one end of the second wiring lead onto an area other than areas of the first and second adhesive tapes.

4. The semiconductor device according to claim 1, further including a second wiring lead and a support lead for supporting the second wiring lead, wherein the second wiring lead is supported by two inner leads from one of the first and second sets of inner leads and the support lead extending at an angle from one end of the second wiring lead onto an area other than areas of the first and second adhesive tapes.

5. The semiconductor device according to claim 1, wherein the wiring lead has three end portions each spaced apart from the major surface of the semiconductor chip, the three end portions each being depressed from the inner leads connected thereto toward the semiconductor chip by a distance less than a thickness of the first and second adhesive tapes, located outside the respective adhesive tapes and formed integral with the inner leads.

6. The semiconductor device according to claim 5, wherein the bonding wires are spaced apart from the wiring lead and connected, at one end, to upper surfaces of the inner leads, respectively, and at the other end, to the bonding pads which are provided on the semiconductor chip.

7. A semiconductor device comprising:
   a semiconductor chip having a major surface;
   a first set of inner leads provided at a first side of the semiconductor chip through a first adhesive tape;
   a second set of inner leads provided at a second side of the semiconductor chip through a second adhesive tape, the second side being opposite the first side;
   a plurality of bonding pads between the first and second sets of inner leads;
   a plurality of bonding wires connected between the inner leads and the bonding pads; and
   a first wiring lead provided between the first and second sets of inner leads, the first wiring lead being supported by at least one inner lead from each of the first and second sets of inner leads.

8. The semiconductor device according to claim 7, further including a second wiring lead, wherein the second wiring lead is supported by at least one inner lead from each of the first and second sets of inner leads.

9. The semiconductor device according to claim 7, further including a second wiring lead and a support lead for supporting the second wiring lead, wherein the second wiring lead is supported by at least one inner lead from one of the first and second sets of inner leads and the support lead extending in a substantially parallel direction from one end of the second wiring lead onto an area other than areas of the first and second adhesive tapes.

10. The semiconductor device according to claim 7, further including a second wiring lead and a support lead for supporting the second wiring lead, wherein the second wiring lead is supported by at least one inner lead from one of the first and second sets of inner leads and the support lead extending at an angle from one end of the second wiring lead onto an area other than areas of the first and second adhesive tapes.

11. The semiconductor device according to claim 7, wherein the wiring lead has at least two end portions each spaced apart from the major surface of the semiconductor chip, the at least two end portions each being depressed from inner leads connected thereto toward the semiconductor chip by a distance less than a thickness of the first and second adhesive tapes, located outside the respective adhesive tapes and formed integral with the inner leads.

12. The semiconductor device according to claim 11, wherein the bonding wires are spaced apart from the wiring lead and connected, at one end, to upper surfaces of the inner leads, respectively, and at the other end, to the bonding pads which are provided on the semiconductor chip.

* * * * *